US009398237B2

(12) United States Patent
Brady et al.

(10) Patent No.: US 9,398,237 B2
(45) Date of Patent: Jul. 19, 2016

(54) IMAGE SENSOR WITH FLOATING DIFFUSION INTERCONNECT CAPACITOR

(71) Applicant: Sony Corporation, Tokyo (JP)

(72) Inventors: Frederick Brady, Webster, NY (US); Sungin Hwang, Pittsford, NY (US); Thomas R. Ayers, Morgan Hill, CA (US)

(73) Assignee: Sony Corporation, Tokyo (JP)

( * ) Notice: Subject to any disclaimer, the term of this patent is extended or adjusted under 35 U.S.C. 154(b) by 90 days.

(21) Appl. No.: 14/265,660

(22) Filed: Apr. 30, 2014

(65) Prior Publication Data

US 2015/0319386 A1 Nov. 5, 2015

(51) Int. Cl.
H04N 5/369 (2011.01)

(52) U.S. Cl.
CPC .................... *H04N 5/369* (2013.01)

(58) Field of Classification Search
CPC ..... H04N 5/369; H04N 3/1512; H04N 5/374;
H04N 5/3741; H01L 21/768; H01L 27/1464;
H01L 27/14636; H01L 31/14; H01L 31/0216;
H01L 31/02; H01L 27/14641; H01L
27/14609; H01L 31/0232; H01L 27/12;
H01L 27/14645; H01L 27/14614; H01L
27/14689
See application file for complete search history.

(56) References Cited

U.S. PATENT DOCUMENTS

| 6,717,267 | B1 | 4/2004 | Kunikiyo | |
| 8,896,125 | B2* | 11/2014 | Kagawa | H01L 23/481 257/774 |
| 2002/0154253 | A1 | 10/2002 | Cairns | |
| 2006/0250558 | A1 | 11/2006 | Burns | |
| 2007/0114629 | A1 | 5/2007 | Dosluoglu et al. | |
| 2010/0133635 | A1* | 6/2010 | Lee | H01L 27/14623 257/433 |
| 2010/0230579 | A1* | 9/2010 | Watanabe | H01L 27/14609 250/208.1 |
| 2010/0243868 | A1* | 9/2010 | Liu | H01L 27/1462 250/216 |

(Continued)

FOREIGN PATENT DOCUMENTS

| JP | 2003-101006 A | 4/2003 |
| JP | 2008-166810 A | 7/2008 |
| JP | 2012-147169 A | 8/2012 |

OTHER PUBLICATIONS

International Search Report; International Application No. PCT/US2015/022473; Date of mailing of the Search Report: Jul. 7, 2015. (Form PCT/ISA/210).

(Continued)

*Primary Examiner* — Aung S Moe
(74) *Attorney, Agent, or Firm* — Michael Best and Friedrich LLP

(57) ABSTRACT

An image sensor includes a pixel circuit that includes a light sensing element and a charge storage node formed in a substrate, an output element having a control electrode formed in an electrode layer above the substrate, the output element generating an output signal corresponding to charge generated by the light sensing element and held by the charge storage node, and a local metal interconnect that electrically connects the charge storage node to the control electrode. Control wirings that control operations of the pixel circuit are formed in wiring layers that are located above the electrode layer. The metal interconnect is formed in a layer that is located above the electrode layer and below a lowest one of the wiring layers such that a given one of the control wirings overlaps the metal interconnect so as to form a parallel plate capacitor in a region of overlap.

28 Claims, 16 Drawing Sheets

(56) References Cited

U.S. PATENT DOCUMENTS

| | | | |
|---|---|---|---|
| 2010/0245641 A1* | 9/2010 | Takata | H04N 5/23241 348/300 |
| 2011/0049589 A1* | 3/2011 | Chuang | H01L 27/14609 257/292 |
| 2011/0227184 A1 | 9/2011 | Mao | |
| 2012/0187514 A1* | 7/2012 | Mentzer | H01L 27/14609 257/432 |
| 2012/0273651 A1* | 11/2012 | Willassen | H01L 27/14641 250/208.1 |
| 2013/0070141 A1 | 3/2013 | Watanabe | |
| 2013/0113065 A1 | 5/2013 | Quin | |
| 2014/0084143 A1* | 3/2014 | Sakano | H01L 27/14609 250/208.1 |
| 2014/0085523 A1* | 3/2014 | Hynecek | H01L 27/14605 348/311 |
| 2014/0091414 A1* | 4/2014 | Shimotsusa | H01L 21/76898 257/431 |
| 2014/0094030 A1* | 4/2014 | Shimotsusa | H01L 21/768 438/652 |
| 2015/0079718 A1* | 3/2015 | Chen | H01L 27/14634 438/59 |

OTHER PUBLICATIONS

Written Opinion; International Application No. PCT/US2015/022473, Date of mailing of the Written Opinion: Jul. 7, 2015. (Form PCT/ISA/237).

* cited by examiner

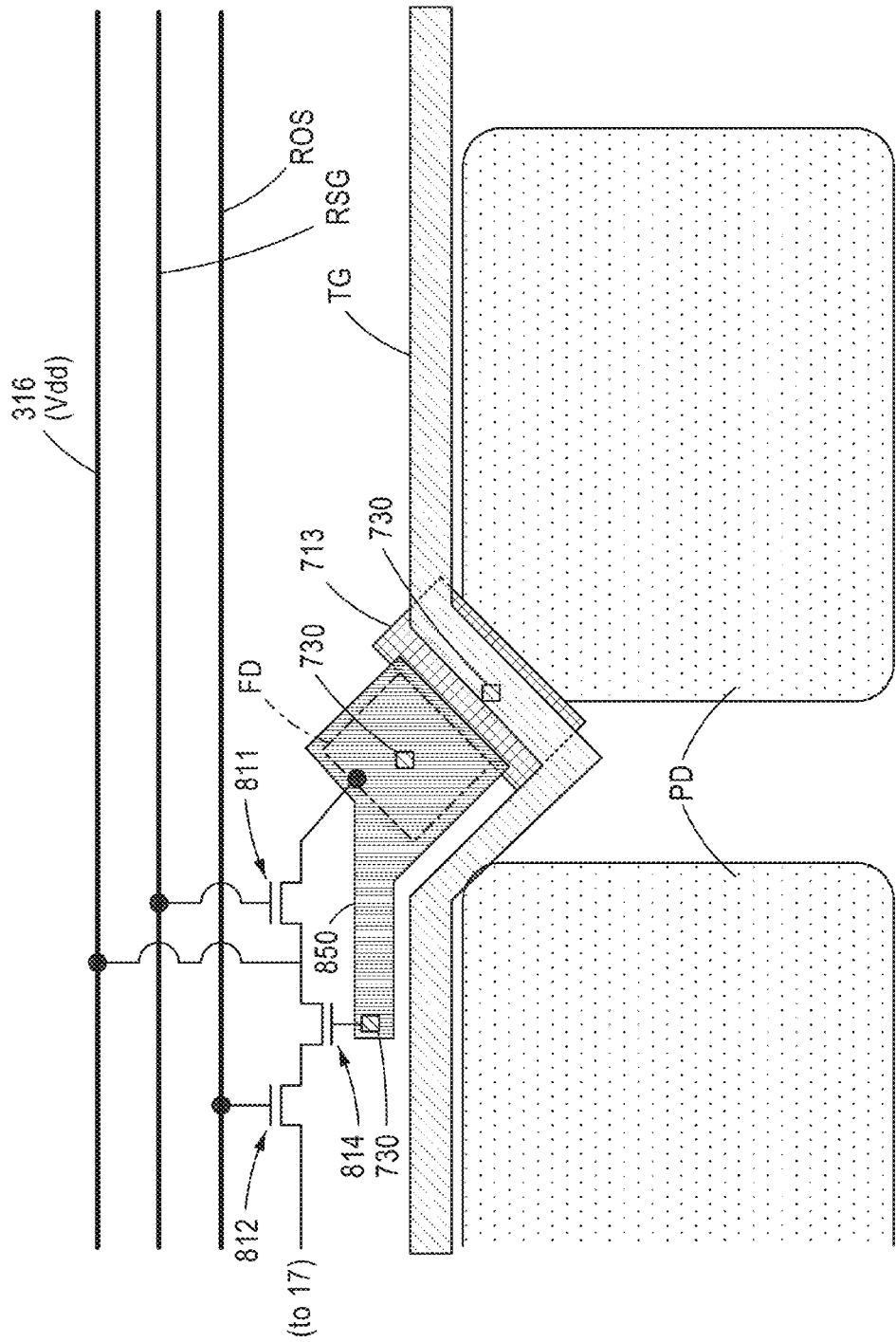

IMAGE SENSOR WITH FLOATING DIFFUSION INTERCONNECT CAPACITOR

BACKGROUND

1. Technical Field

The invention relates to image sensor systems and, in particular although not exclusively, to active pixel CMOS image sensors implementing an electronic global shutter.

2. Background Art

Digital image capturing devices use image sensors to convert incident light energy into electrical signals. An image sensor includes a two-dimensional array of light sensing elements called pixels. For example, a CMOS image sensor includes an n×m array of photosensitive structures (for example, photodiodes) as well as circuit elements for readout and control (a photodiode plus its immediate readout and control transistors are typically called a "pixel"). Each pixel in the array produces an electrical signal corresponding to an amount of light incident upon the pixel during an integration period. Outputs from the light sensing elements are converted to digital form and stored digitally to form raw data representing a scene. The raw data can be processed by an image processor to produce rendered digital images. Image sensor designs include Charged Coupled Devices (CCD), Complementary Metal Oxide Silicon (CMOS) image sensors, Digital Pixel System (DPS) sensors, and the like. CMOS image sensors are advantageous in that they consume a lower level of power.

Active pixel CMOS image sensors are designed to include control elements (e.g. MOS transistors) at each pixel for controlling photon integration in the photodetector, controlling reset, and providing a conversion gain to the pixels. Active pixel CMOS image sensors can support either rolling shutter or global shutter modes, or both.

In both rolling shutter and global shutter modes, the signal charge generally sits on a floating diffusion FD (described further below) until the row is read out. In rolling shutter mode, signal charge only waits on the floating diffusion for several microseconds before being read out. In global shutter mode, however, this time can be easily several milliseconds. During the time the floating diffusion is waiting to be read out, it can collect substantial dark signal, as the floating diffusion dark current is typically quite high (1000-2000 e−/s at 60 C). This dark signal increases FPN and temporal noise. Additionally, when the signal charge is sitting on the floating diffusion waiting to be read out, the next frame is being integrated in the photodiode, and light from this next frame can distort the image of a current frame if the light reaches the floating diffusion prior to the signal being read out.

Accordingly, the present disclosure provides for an image sensor in which dark current flowing to a floating diffusion can be reduced and light can be prevented from reaching the floating diffusion.

BRIEF DESCRIPTION OF THE DRAWINGS

FIG. 8 illustrates a layout of a comparative pixel circuit.

DETAILED DESCRIPTION

[Image Sensor—General Configuration]

Figure 1:
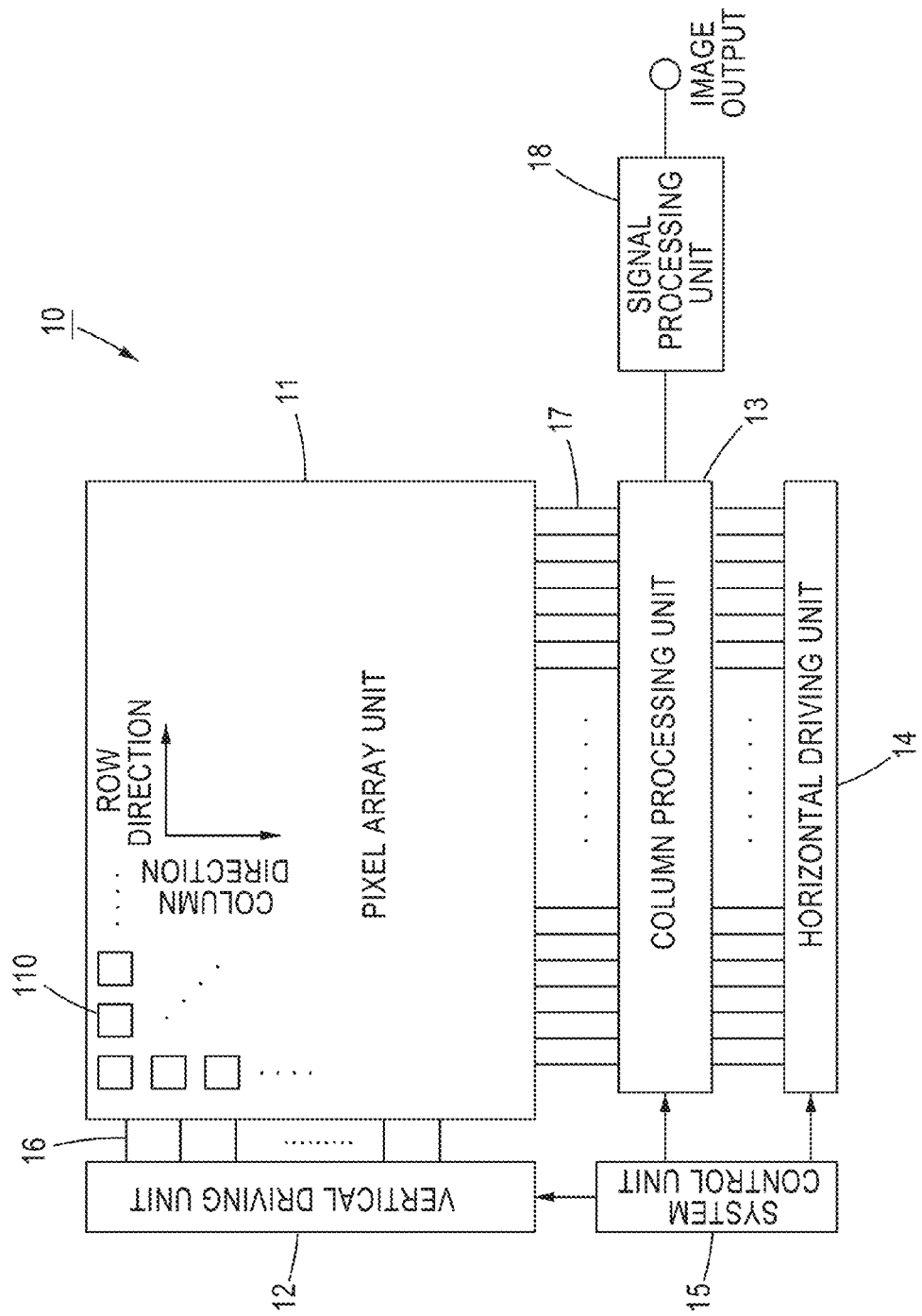
FIG. 1 illustrates an exemplary image sensor.
Figure 2:
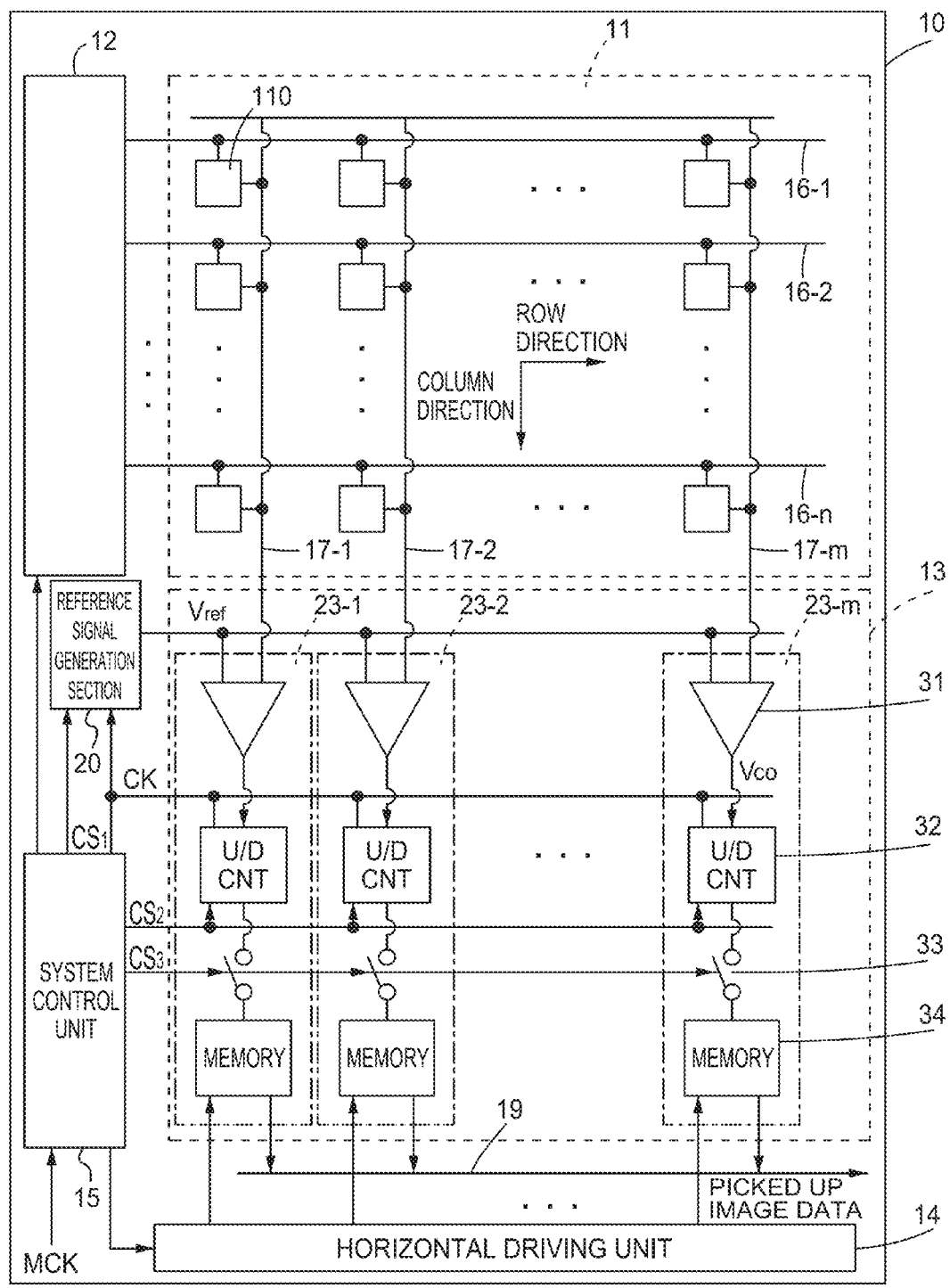
FIG. 2 illustrates an exemplary image sensor.
Figure 7A:
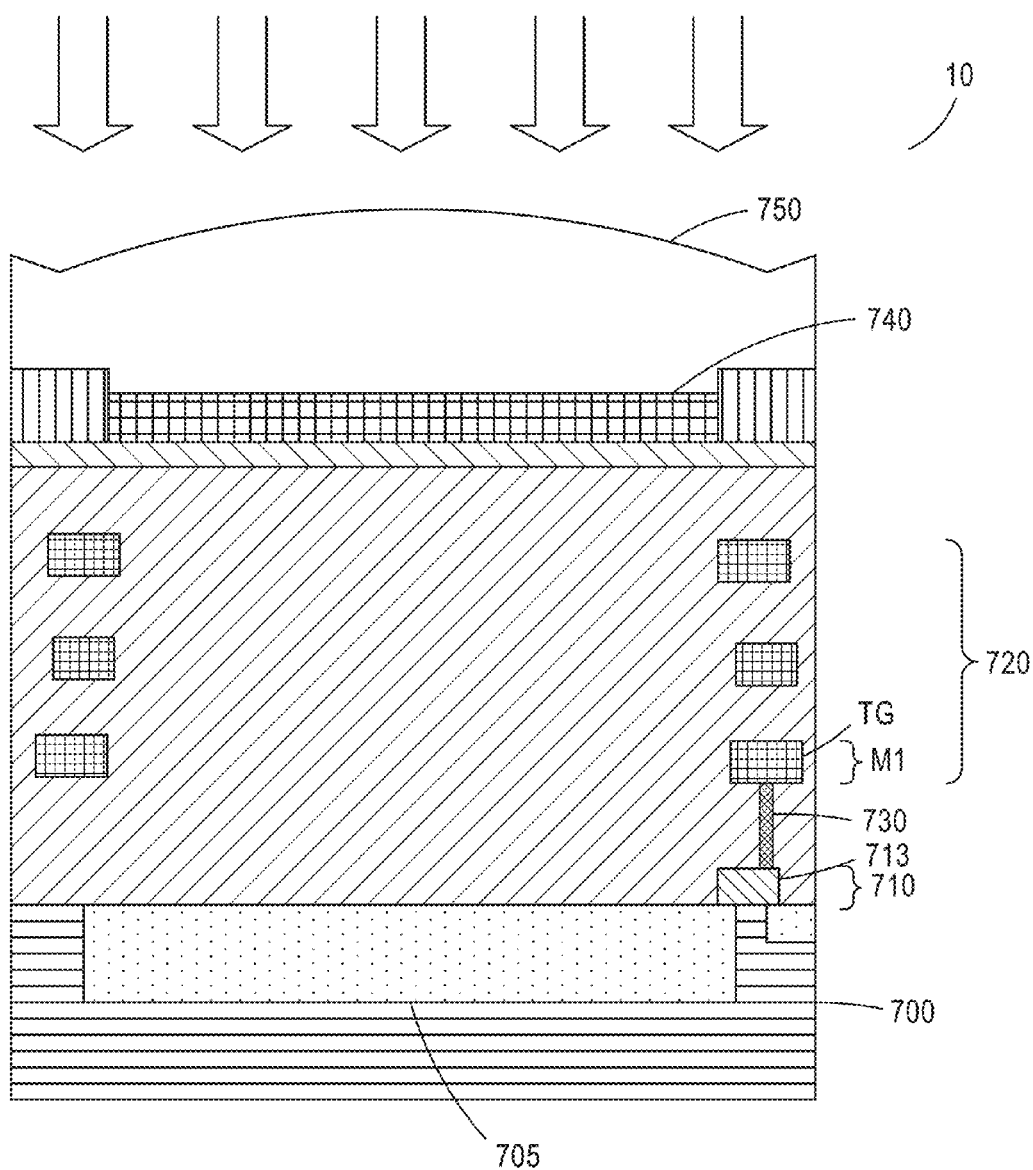
FIG. 7A illustrates cross section of an exemplary image sensor.
Figure 7B:
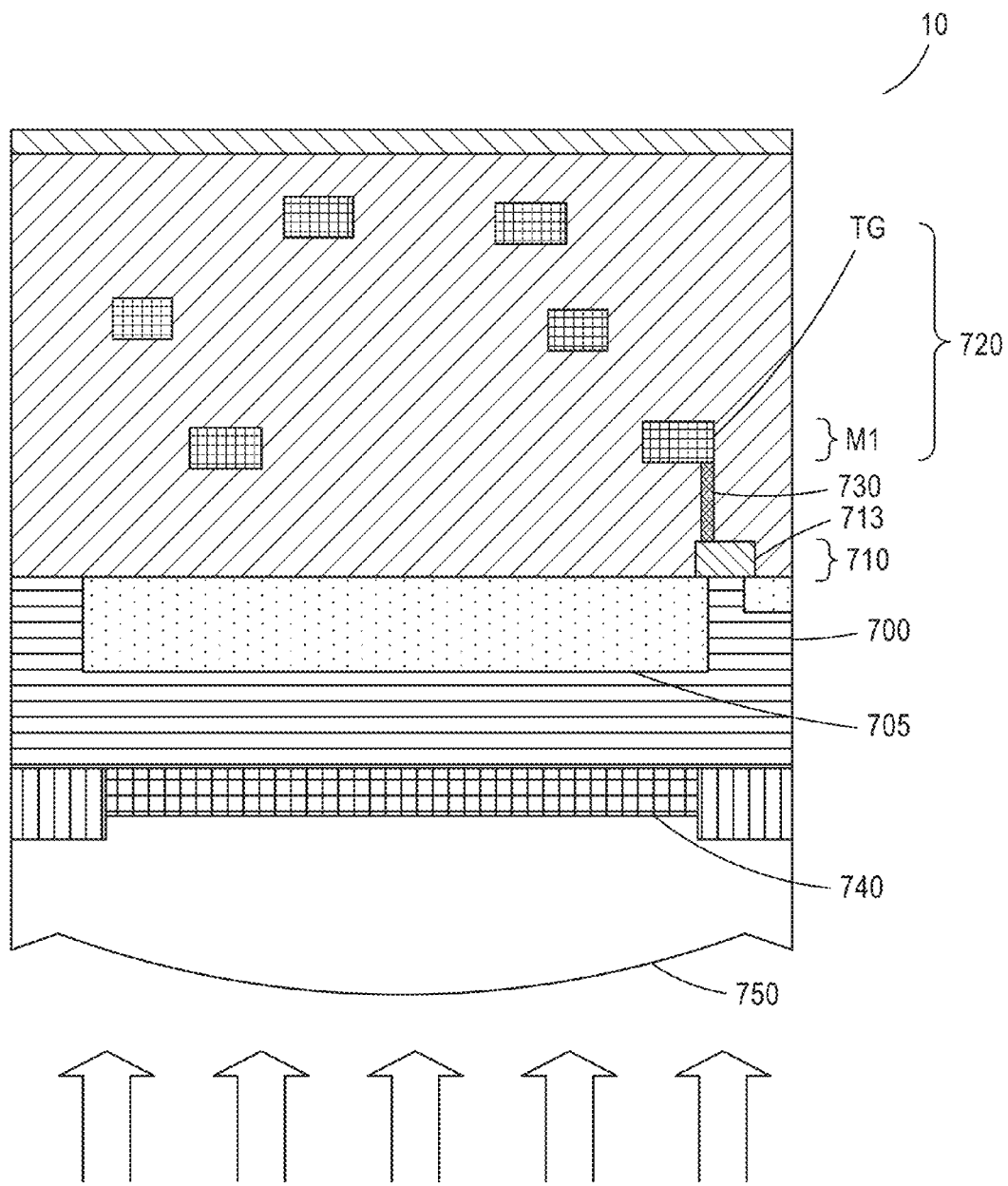
FIG. 7B illustrates cross section of an exemplary image sensor.

FIGS. 1 and 2 illustrates an exemplary CMOS image sensor 10. The image sensor 10 is formed on a semiconductor substrate 700 (for example, silicon substrate 700 as shown in FIGS. 7A and 7B). The image sensor 10 includes a pixel region 11 in which pixels 110 are arranged, for example, in a n×m matrix shape having n rows and m columns. The pixel region 11 may include an effective pixel region (not illustrated) and an optical black pixel region (not illustrated). Pixels 110 in the effective pixel region are for outputting pixel signals which correspond to the bits (also called dots or pixels) of an image created by the image sensor. Pixels in the optical black region, on the other hand, are for outputting black level signals used as a reference for various noise cancellation techniques. Pixels in the optical black region are generally identical to the pixels 110 in the effective pixel region except that they are shielded from incident light. The optical black region is generally provided at the periphery of the effective pixel region along one or more edges of the pixel region 11. The pixel region 11 may also include dummy pixels, which may be included for performing various functions, but which do not correspond to bits in the output image. Hereinafter, when a "pixel 110" is referred to, a pixel for outputting pixel signals which correspond to the bits of an image created by the image sensor is meant, unless explicitly indicated otherwise. Each pixel 110 is configured by a photodiode PD as a light receiving element having a photoelectric conversion function, and MOS transistors. Detailed configurations of the pixel 110 will be discussed further below.

The image sensor includes various driving sections arranged around the periphery of the pixel region 11. These driving sections control the operations of the image sensor, and may be collectively referred to as a "control section" when differentiation therebetween is not necessary. The operations of the pixels 110 are controlled by the vertical driving unit 12, which applies signals to control lines 16 that are connected to rows of pixels. The vertical driving unit 12 may include address decoders, shift registers, and the like, as is familiar in the art, for generating control pulses. An operation of reading out signals from the pixels 110 is performed via the column processing unit 13 (described further below), which is connected to columns of pixels via the column readout lines 17. The horizontal driving unit 14 controls the readout operations of the column processing unit 13, and may include shift registers and the like, as is familiar in the art. A system control unit 15 is provided to control the vertical driving unit 12, the column processing unit 13, and the horizontal driving unit 14, by, for example, generating various clock pulses and control pulses. The signals read out by the column processing unit 13 are output to a signal processing unit 18 which performs various signal processing functions and outputs image data. This general configuration is described merely as an example, and it will be understood that alternative configurations could also be implemented. For example, the signal processing unit 18 and/or a storage unit (not illustrated) could be configured in a column-parallel manner similarly to the column processing output unit 13 such that each column's pixel signals undergo signal processing in parallel. As another example, the signal processing unit 18 and/or a storage unit (not illustrated) can be included in the same integrated circuit as the pixel array unit 11, or may be provided in a different circuits not integrated with the pixel array unit 11.

As shown in FIG. 2, the column processing unit 13 may include an analog-to-digital ("AD") converter 23 for each column. Thus, AD conversion is performed in a column-parallel manner as pixel signals are read out one row at a time. In particular, the vertical driving unit selects one row at a time for readout, and each pixel 110 in the selected row outputs a signal to column readout line 17 to which it is connected. The AD converters 23 for each column performs AD conversion on the signals in parallel, and then the horizontal driving unit causes the AD converters 23 to output the digital signals to the horizontal output line 19 serially (i.e., one at a time).

The AD converter 23 includes a comparator 31, a counter 32, a switch 33, and a memory (latch) 34. The comparator 31 has one input connected to one of the column readout lines 17, and the other input connected to a reference voltage Vref generated by the reference signal generation section 20. The output of the comparator 31 is connected to the counter 32, whose output is connected via switch 33 to the memory 34. For a readout operation, the reference signal generation section 20 causes the voltage Vref, beginning at a time $t_0$, to take the form of a ramp voltage that changes magnitude approximately linearly with time at a set rate. The counter 32 starts counting at time $t_0$, and when the voltage Vref matches the potential carried on the column readout line 17 (call it time $t_1$), the comparator 31 inverts its output causing the counter 32 to stop counting. The count of the counter 23 corresponds to the amount of time between $t_0$ (when Vref starts to change magnitude) and $t_1$ (the time Vref matches the potential of the column readout line 17). Because the rate of change of Vref is known, the time between $t_0$ and $t_1$ corresponds to the magnitude of the potential of the column readout line 17. Thus, the analog potential of the column readout line 17 is converted into a digital value output by the counter 23. The digital value output by the counter 23 is output via switch 33 to the memory 34, where the digital value is held until the horizontal driving unit causes the memory to output the value via the horizontal output line 19. A correlated double sampling (CDS) technique may be employed, in which a reset level is subtracted from the pixel signal so as to cancel out variations between reset levels across pixels and time. In the CDS technique, for each readout operation, first a reset signal is read out via column readout line 17, followed by a pixel signal being read out via column readout line 17, and the two signals are subtracted. Preferably, the AD converter 23 may perform the subtraction itself, for example by causing the counter 23 to count down when the reset signal is being read out, and then to count up from the down-counted value when the pixel signal is being read out. Thus, the counter 23 outputs a value that equals the up-count resulting from the pixel signal minus the down-count resulting from the reset signal, which means that the counter 23 outputs a value corresponding to the pixel signal minus the reset signal. However, the analog signals may be subtracted before AD conversion or the digital values may be subtracted after AD conversion.

The system control unit 15 may generate clock signals and control signals for controlling the various other sections, such as the clock signal CK and the control signals $CS_1$, $CS_2$, and $CS_3$, based on a master clock signal MCK input into the system control unit 15. The master clock signal MCK may be, for example, input from a circuit other than the integrated circuit in which the pixel region 11 is included (e.g., from a processor of a device in which the image sensor is installed).

The control lines 16 and the column readout lines 17 are formed in multiple wiring layers 720 that are laminated on top of each other with inter-layer insulating films therebetween (for example, see FIGS. 7A and 7B). The wiring layers 720 are formed on top of the pixels on a front-face side of the semiconductor substrate 700.

In embodiments of the present invention, the image sensor 10 can either be a monochrome or a color sensor with a color filter array. To implement a color image sensor, an array of selectively transmissive filters 740 is superimposed over the pixel array in registration with each of the pixel elements, as shown in FIGS. 7A and 7B, the filters 740 each filtering certain predetermined wavelengths of light. The array of color filters 740 may be arranged in any manner. For example, the filter array may include Red, Green, and Blue (RGB) color filters arranged in a Bayer pattern. A demosaicing algorithm is used in the image processing pipeline to produce color images based on pixel data obtained from the color image sensor.

As shown in FIGS. 7A and 7B, the image sensor may also include on-chip lens layer 750, which may include a plurality of micro lenses. Each micro lens may be formed so as to correspond to one or more photodiodes, and is configured to focus the incident light to the corresponding photodiode(s).

The image sensor 10 may be utilized in a front-side illumination type sensor or in a back-side illumination type sensor. A front-side illuminated image sensor is configured to be irradiated with light from the front-face side of the semiconductor substrate 700 (recall that the front-face of the semiconductor substrate 700 is the face upon which the wiring layer is formed). An example of a front-side illuminated image sensor is shown in FIG. 7A. A back-side illuminated image sensor, on the other hand, is configured to be irradiated from the back-face side of the semiconductor substrate 700 (i.e., the side opposite to the side upon which the wiring layers are formed). An example of a back-side illuminated image sensor is shown in FIG. 7B. If a color filter layer 740 and/or an on-chip lens layer 750 are provided for the image sensor 10, they are disposed on the side of the semiconductor substrate 700 that is irradiated with light. Thus, in a front-side illuminated image sensor the color filter layer 740, on-chip lens layer 750, and wiring layers 720 are provided on the same side of the semiconductor substrate 700 as one another, whereas in a back-side illuminated image sensor the color filter layer 740 and on-chip lens layer 750 are provided on a side opposite to the side on which the wiring layer are provided. A back-side illuminated sensor may be formed by first forming the pixels and wiring layers 720 on the front-side of a transparent substrate 700, and thereafter turning the chip over and forming an on-chip optical system (such as the color filter 740 and the microlens array 750) on the back-side of the substrate 700 in alignment with the pixels formed on the opposite side of the substrate 700. A back-side illuminated sensor has an advantage that the wirings of the wiring layers 720 do not block any light from reaching the PD regardless of how they are configured, thereby increasing sensitivity of the sensor. A frontside illuminated sensor has an advantage of being easier and cheaper to produce.

[Pixel Circuit—General Configuration and Operation]

Figure 3:
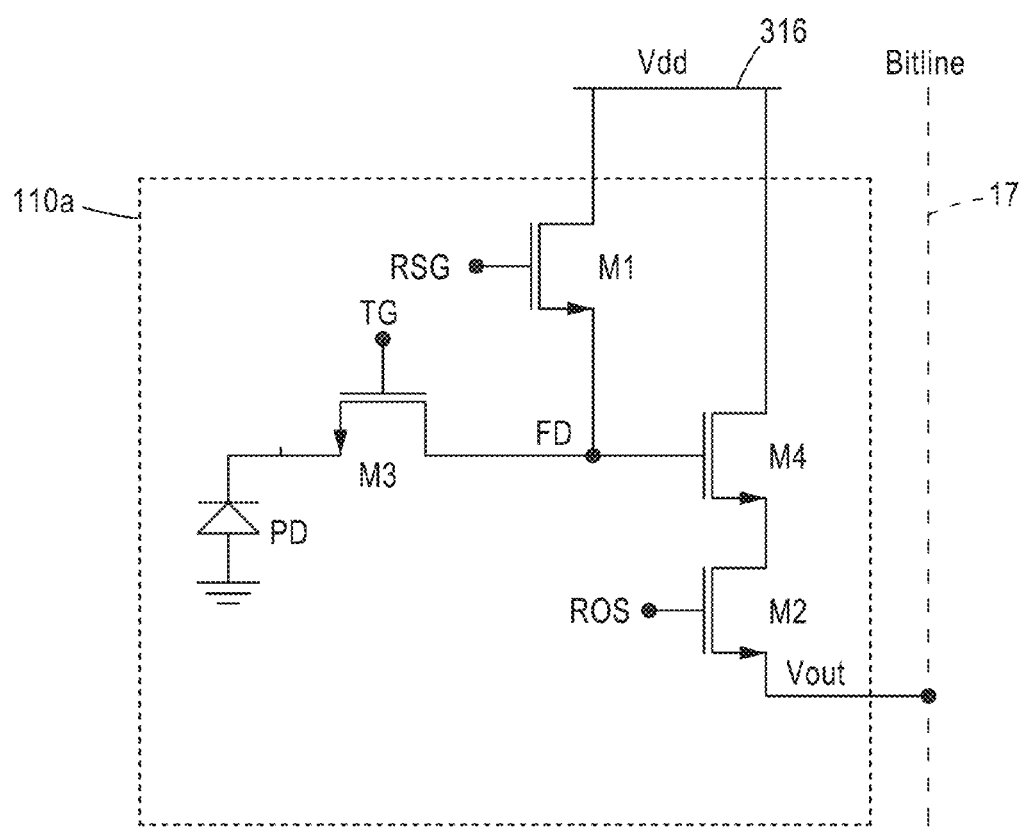
FIG. 3 illustrates a schematic diagram of an exemplary pixel circuit.
Figure 4:
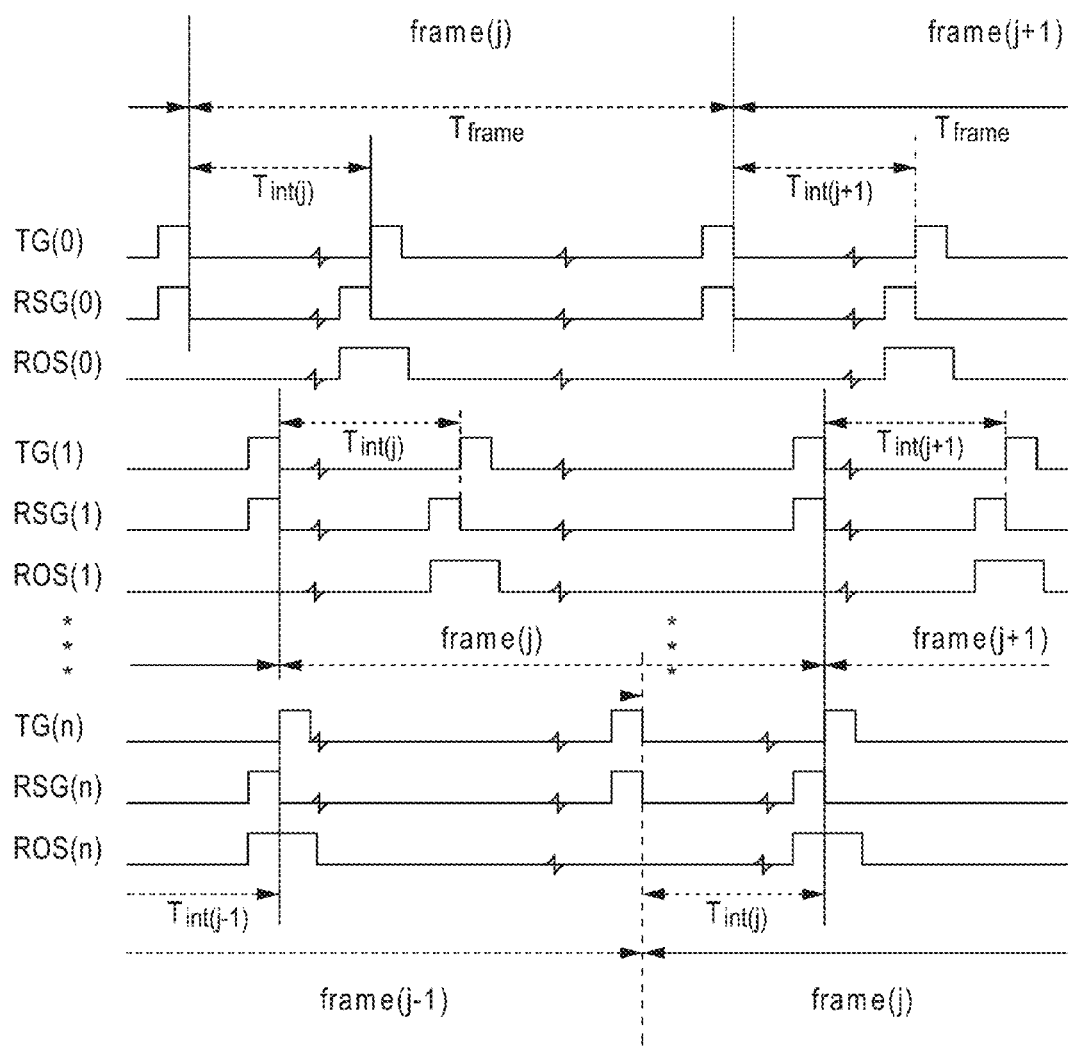
FIG. 4 illustrates an exemplary signal timing diagram for operation of a pixel circuit.
Figure 5:
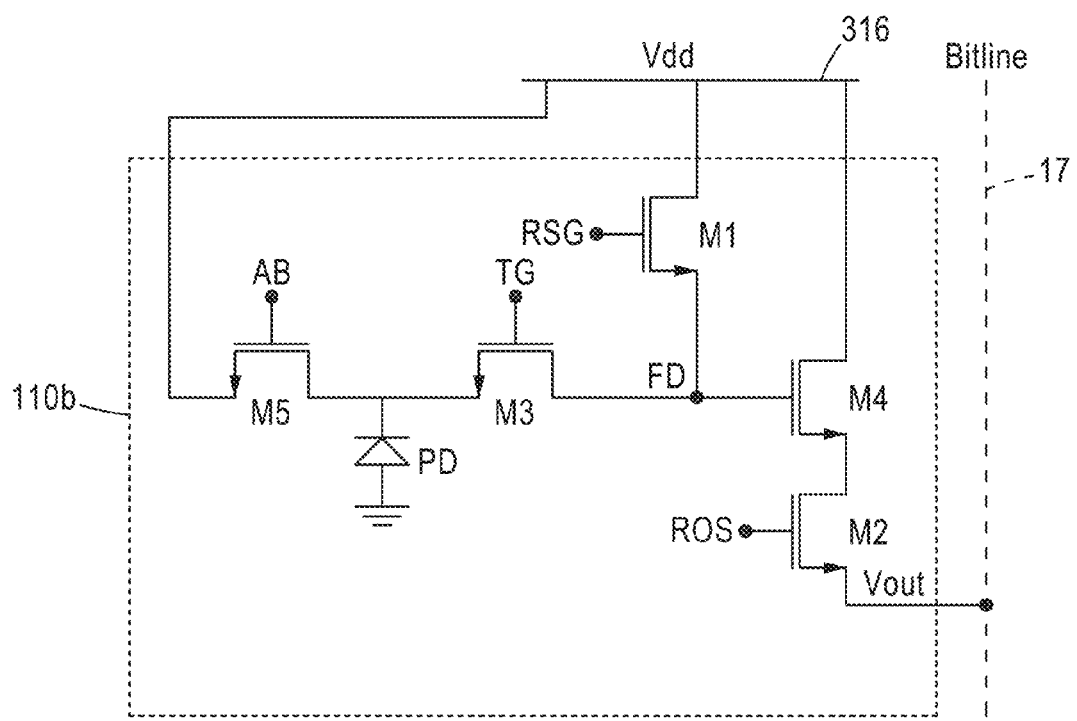
FIG. 5 illustrates a schematic diagram of an exemplary pixel circuit.
Figure 6:
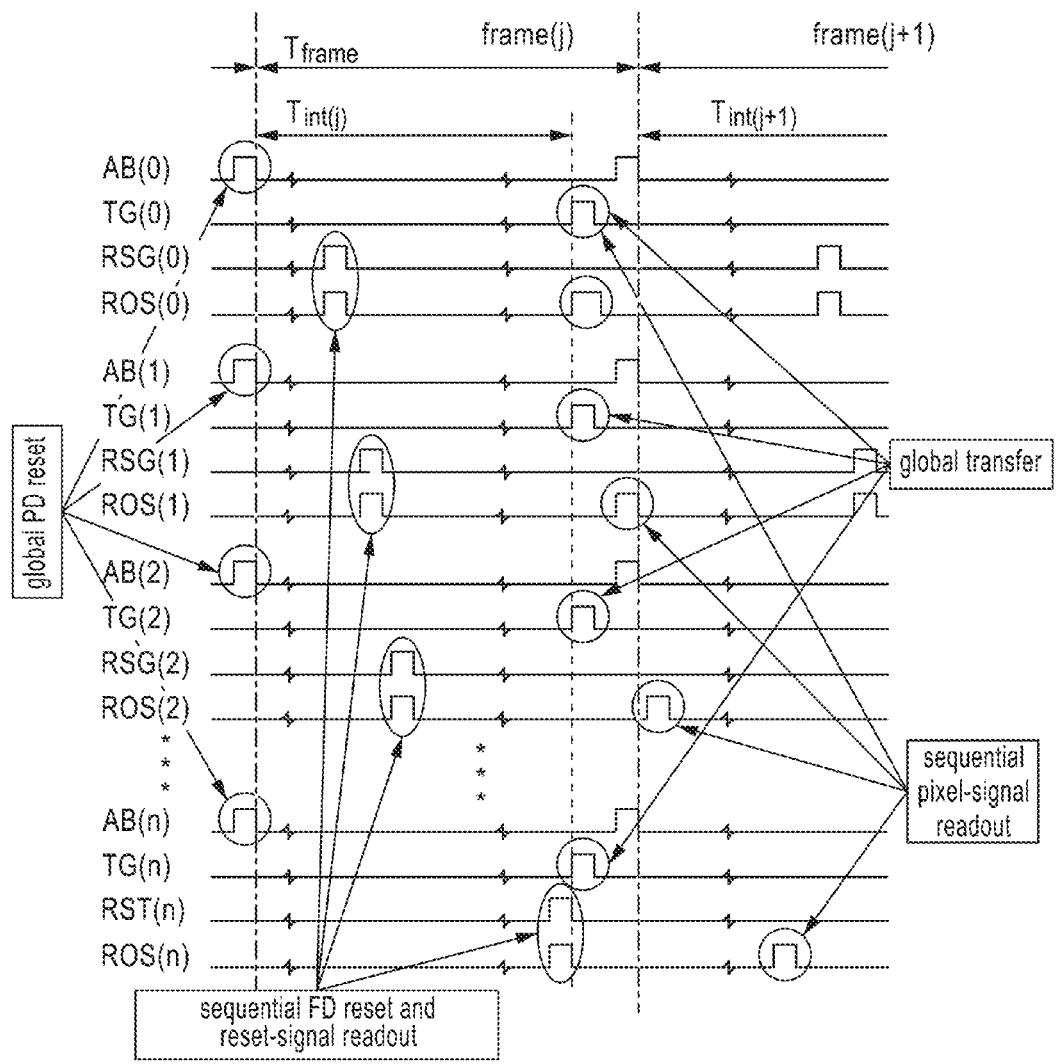
FIG. 6 illustrates an exemplary signal timing diagram for operation of a pixel circuit.

FIGS. 3 and 5 illustrate exemplary schematic configurations of the pixels 110—in particular the configurations represented by pixels 110a and 110b, respectively (discussed further below). These schematic configurations are general in nature, and thus do not show certain details that are characteristic of the embodiments of the present disclosure, such as the specific layout of the interconnect 950, which will be discussed in greater detail below. However, the pixels 110 of the present disclosure are not limited to these exemplary schematic configurations. Thus, for example, new transistors could be added to the pixels 110a/b, or existing transistors could be removed from or relocated within the pixels 110a/b without departing from the scope of the present disclosure. Thus, the pixel 110 can be schematically configured using any general active pixel architecture that includes a charge storage node connected to a readout node by an interconnect, presently known or to be developed. FIGS. 4 and 6 illustrate operation of the pixels 110a and 110 b in rolling shutter or global shutter modes, respectively. It will be understood that different operation procedures can be utilized without departing from the scope of the disclosure. Exemplary active pixel architectures are described in Bigas et al., "Review of CMOS image sensors," Microelectronics Journal, 2006.

Two types of global shutter architectures include a first type in which the photodiode charge is transferred directly to a node where it is then read out, and a second type in which the photodiode charge is transferred first to an intermediate node, then it is transferred to a 3rd node from whence it is read out (not illustrated). The second type requires additional circuit elements, reducing photodiode fill factor, and therefore reducing pixel sensitivity and quantum efficiency. Therefore, the first type, such as those pixels 110a/b illustrated in FIGS. 3 and 5 may be preferred in smaller pixels where fill factor is important (although the second type is certainly within the scope of the disclosure).

FIG. 3 illustrates a schematic representation of an exemplary pixel 110a that can operate in either rolling shutter or global shutter modes, but is generally utilized for rolling shutter modes. The pixel 110a includes a photodiode PD (sometimes referred to simply as a "PD") that converts incident light into charge, a transfer gate transistor M3 that controls transfer of the charge accumulated by the PD, a Floating Diffusion FD (sometimes referred to simply as an "FD") which receives the charge transferred from the PD, an amplifier transistor M4 that produces an pixel signal corresponding to the potential of the charge of the FD, a readout transistor M2 that controls readout of the pixel signal, and a reset transistor M1 that controls resetting of the FD.

FIG. 5 illustrates a schematic representation of an exemplary pixel 110b that can operate in either rolling shutter or global shutter modes, but is generally utilized for global shutter modes. The pixel 110b may include the same circuit elements as the pixel 110a, and in addition includes the global shutter transistor M5, which controls a start of an integration period for the pixel 110b.

In both rolling shutter and global shutter modes, an integration period begins for the pixel 110a/b when the PD of the pixel is reset, and the integration period ends for the pixel when the charge is transferred away from the PD via the transfer gate transistor M3. Resetting the PD clears any charge accumulated in the PD and begins a new integration period.

FIG. 4 illustrates an operation of the pixel 110a in rolling shutter mode. When the image sensor first begins an image sensing operation after a period of non-operation, an initial operation of affirmatively resetting the PD may be performed in which the transfer gate transistor M3 and the reset transistor M1 are simultaneously turned on by lines TG and RSG, respectively, thereby connecting the PD to the power supply line 216 carrying the power supply voltage Vdd. This clears any charges accumulated in the PD and begins an integration period, during which the PD accumulates charge at a rate corresponding to the amount of light incident on the PD. Immediately before the integration period Tint ends, the reset transistor M1 is again turned on via a pulse on RSG to reset the FD, clearing any charge that accumulated in the FD (e.g., from dark current), and the readout transistor M2 is also turned on via line ROS allowing readout of a signal corresponding to the reset level of the FD. The reset-level signal may be used for correlated double sampling (CDS) or other noise correction techniques. Next, the transfer gate transistor M3 is turned on again via line TG, causing the charge accumulated in the PD to be transferred to the FD. This clears the PD of charge and ends the integration period. The readout gate is then turned on (or rather simply maintained in an ON state after the reset level is read out), allowing the potential of the FD after the charge transfer to be read out to a column readout line 17 (bitline) as a pixel level signal.

The transfer of charge from the PD to the FD may be treated as an effective resetting operation for the PD, and thus an integration period for a next frame may begin as soon as the transfer gate transistor M3 is turned off. However, more usually for a pixel architecture of the pixel 110a another affirmative resetting operation may be performed after the pixel level signal is read out, in which case the integration period for the next frame would begin immediately after the resetting (by affirmative resetting of the PD it is meant that the PD is connected to the power supply line 216, in contrast to merely effectively resetting the PD by transferring charge from the PD to the FD).

In the rolling shutter mode, actions are performed on a row by row basis. Thus, as shown in FIG. 4, each row of pixels starts its integration period (i.e., has its photodiode reset) at a later time than the pixels in the immediately preceding row. Thus, while the duration of the integration period is identical for all rows, the starting and ending times thereof are different for each row. Accordingly, fast moving objects become distorted with rolling shutter timing, since when an object moves across the sensor's field of view, it is imaged by each row at different points in time. For example, a vertical edge of an object moving quickly from right to left may appear in the captured image as a diagonal line slanting to the right, since the edge may be in column m when row 1 exposure completes, in column m-1 when row 2 exposure completes, and in column m-2 when row 3 exposure completes, and so on. See FIG. 16 for an example of rolling shutter artifacts in an image.

On the other hand, in the global shutter mode, all the pixels in the entire image sensor start and stop exposure or light integration at the same time, thus the problem of geometric distortion due to motion in the scene is suppressed. Using the above example of a vertical edge of an object, it will appear as a vertical line in the captured image since exposure starts and ends simultaneously for all pixels.

Operation of the pixel 110b in global shutter mode is shown FIG. 6. The operation is similar to that shown in FIG. 4, except that in FIG. 6 all pixels are reset at the same time ("Global PD Reset") and all pixels perform a charge transfer operation at the same time ("Global Transfer"). Moreover, affirmative resetting of the PD is accomplished in the pixel 110b simply via turning on the global shutter transistor M5 via the line AB, in contrast to the pixel 110a in which an affirmative resetting operation requires turning on both the transfer gate transistor M3 and the reset transistor M1 together. Resetting the PD via the global shutter transistor M5 allows for the pixel's PD to be affirmatively reset without affecting the charge held on the FD.

The pixel 110a may also in theory perform a global shutter operation if all of the pixel's PDs are reset simultaneously and the charges are transferred simultaneously (not illustrated). However, global shutter is preferably implemented using the pixel 110b, which allows for affirmative resetting of the PD via the global shutter transistor M5. This is because a global reset operation for an n-th frame in the pixel 110a can only be performed after all of the pixel-level signals have been read out from an (n-1)th frame, whereas in the pixel 110b a global reset operation for an n-th frame can be performed before all of the pixel-level signals have been read out from an (n-1)th frame, since the PD resetting operation does not clear the FD charge in the pixel 110b. Since the beginning of a next integration period occurs when the PD is reset, and the PD can be reset sooner in the pixel 110b than in the pixel 110a, the time between integration periods in the pixel 110b is smaller than in the pixel 110a. Decreasing the time between integration periods results in increasing the maximum frame rate of the image sensor, and thus the pixel 110b can perform the global shutter operation at a higher frame rate than the pixel 110a.

Figure 9:
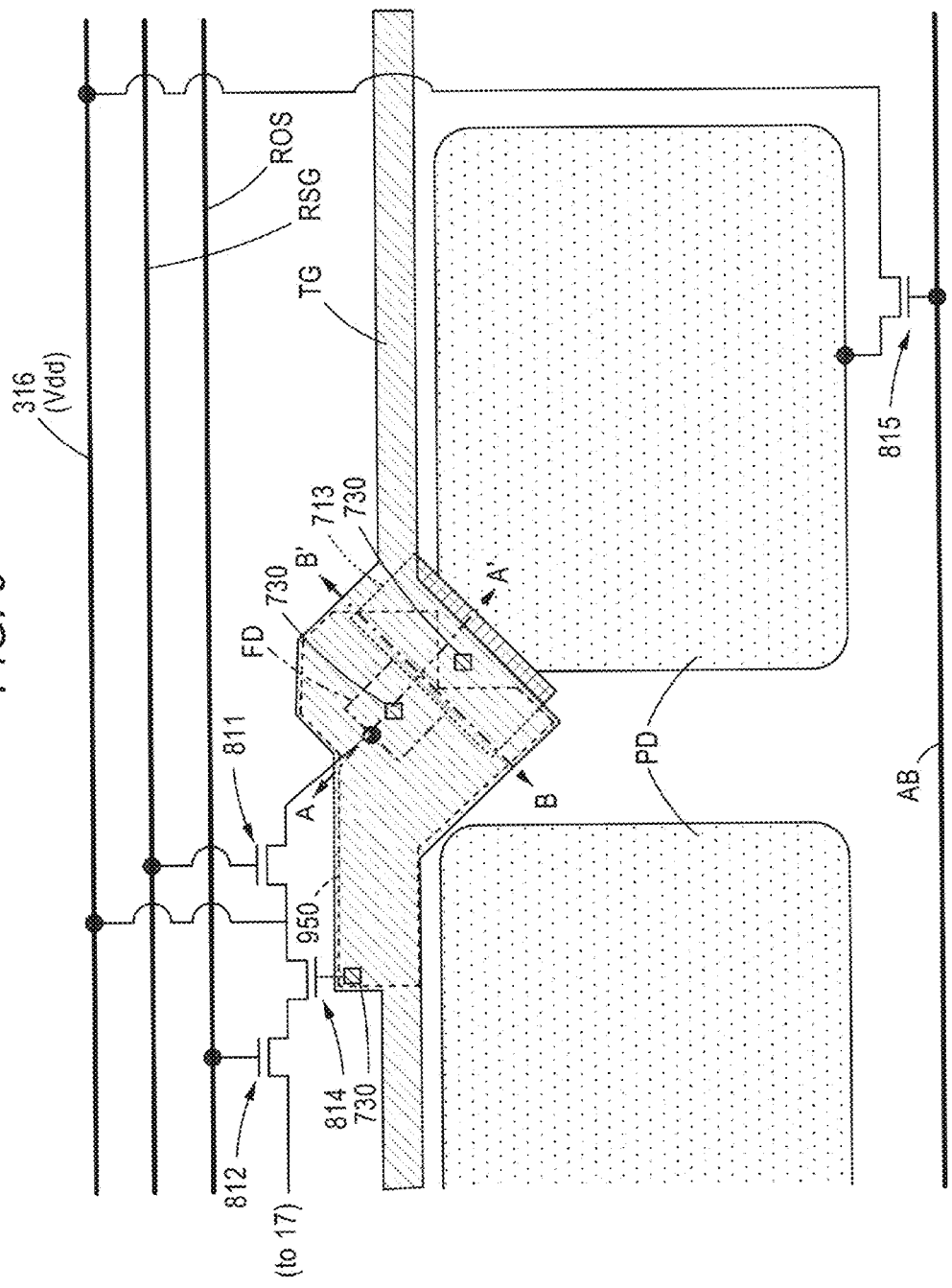
FIG. 9 illustrates a layout of an exemplary pixel circuit.
Figure 10:
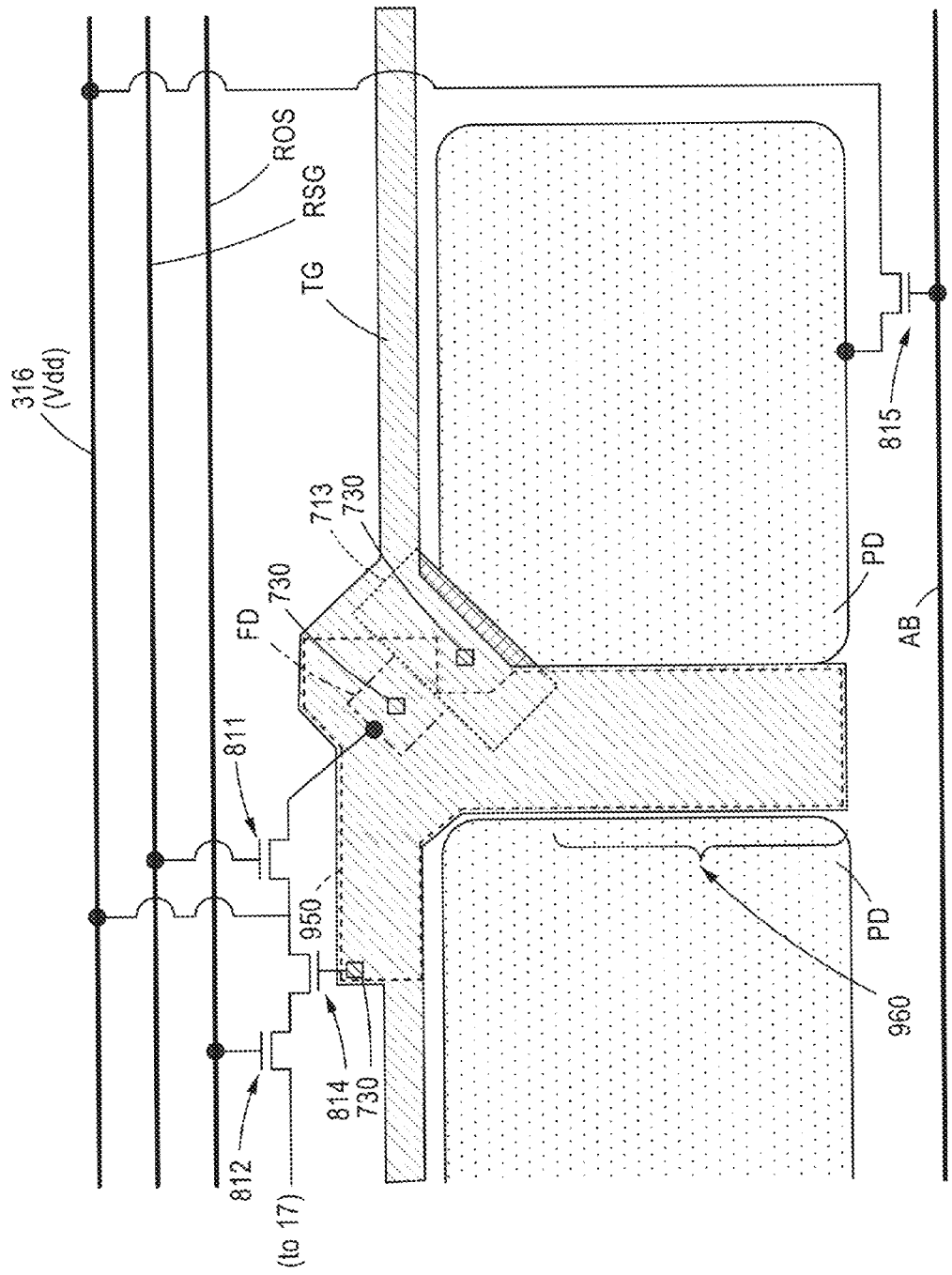
FIG. 10 illustrates a layout of an exemplary pixel circuit.

In FIGS. 7A and 7B, cross-sectional layer views of the pixel 110 are shown. In FIG. 8, a more detailed plan view of a layout of the pixel 110b of a comparative example is shown. In FIGS. 9 and 10 more detailed plan views of layouts of the pixel 110b of the present embodiment are shown. It will be understood that similar layouts could be used for the pixels 110a, simply omitting the transistor M5 and the line AB.

As shown in FIGS. 7A and 7B, the pixel 110 is formed on a substrate 700. In the substrate 700, the PD region 705 may be formed by doping the substrate 700. Transistors may also be formed by appropriately doping the substrate 700 to form source/drain and channel regions and depositing gate electrodes thereof. The gate electrodes may be disposed in a transistor gate layer 710 formed on the substrate 700, and may be made of a conductive material such as polysilicon. FIGS. 7A and 7B illustrate only the transfer gate transistor M3, which has the gate electrode 713 formed in the transistor gate layer 710, a source of the transfer gate transistor M3 is part of the PD, and a drain of the transfer gate transistor M3 is part of the FD. Metal wiring layers 720 are formed on top of the transistor gate layer 710, with an interlayer insulating film disposed between the metal wiring layers 720 and the transistor gate layer 710. The metal wiring layers 720 include the various control lines and readout lines of the pixel array, such as the control lines 16 and readout lines 17, which connect pixels to the peripheral readout and control circuits. The metal wiring layers 720 may also include some local metal interconnects that locally connect various elements within a single pixel 110 to one another. The metal wiring layers 720 include multiple different layers of metal wirings stacked on top of each other with interlayer insulating films disposed therebetween. A lowermost metal wiring layer is referred to in the art as the M1 wiring layer, a next wiring layer stacked on the M1 wiring layer is referred to as the M2 wiring layer, and so on. The metal wirings of the metal wiring layers 720 are connected to the pixel elements via contacts 730 that extend through the interlayer insulating films. For example, as shown in FIGS. 7A and 7B, the gate electrode 713 of the transfer gate transistor M3 is connected via a contact 730 to the transfer gate line TG, which is included in the M1 wiring layer.

[Detailed Pixel Layout—Comparative Example]

As noted above, the pixels 110 of the present disclosure include, regardless of their general configuration, a local interconnect that connects a charge storage node to a readout node. Various advantages of the embodiments of the present disclosure are related to the layout of the local interconnect in relation to other pixel elements. In order to aid understanding these advantages, a comparative example will first be considered in which the local interconnect has a different layout from that of the embodiments of the present disclosure. A layout of a pixel 110 of a comparative example is shown in FIG. 8. FIG. 8 illustrates in detail the layout of the PD, the FD, the gate electrode 713 of the transistor M3, the transfer gate line TG (which is one of the M1 wirings), and the local interconnect 730. Other elements of the pixel are illustrated schematically, since their specific layout is not of interest at this juncture; these other pixel elements include the gate electrode 811 of the transistor M1, the gate electrode 812 of the transistor M2, the gate electrode 814 of the transistor M4, the wiring line 316, the reset gate line RSG, and the readout select line ROS. Circuit elements of adjacent pixels are not illustrated for simplicity, although in practice circuit elements of adjacent pixels may be located in various portions of the layout region shown in FIG. 8. The PD is connected to the FD via the gate electrode 713 of the transfer gate transistor M3. The transfer gate line TG is included in the M1 wiring layer, and is connected to the gate electrode 713. The reset gate line RSG is connected to the gate electrode 811. The readout select line ROS is connected to the gate electrode 812. The power supply line 316 is connected to the transistors M1 and M4. The column readout line 17 is connected to the transistor M2. The gate electrodes of the various transistors of the pixel 110 are disposed on a surface of the substrate, and the wiring lines are disposed in wiring layers above the gate electrodes, as noted above. Thus, contacts 730 may connect the wiring lines to the various pixel elements. It is not specified in FIG. 8 which wiring layer the various wiring lines are located in, except for the TG line and the interconnect 850 which are located in the M1 wiring layer (the lowest wiring layer).

In the comparative example, the FD is connected to the gate 814 of the amplifier transistor M4 by a local interconnect wiring 850 included in the M1 layer. Charge is transferred from the FD to the gate 814 of the amplifier transistor M4 via the interconnect 850. The interconnect 850 is also disposed above the area of the FD such that it can act as a light shield for the FD in order to block parasitic light. However, the interconnect wiring 850 just barely covers the FD region, and thus some parasitic light can enter the FD region from around the sides of the interconnect wiring 850 and in the gap between the wiring 850 and the TG line. While it may be possible to decrease some of this parasitic light by expanding the interconnect wiring 850 so as to cover more of the area surrounding the FD, this has the disadvantageous side effects of reducing fill factor and pixel sensitivity. These side effects occur because expanding the interconnect wiring 850 necessitates moving the TG line a corresponding amount so as to provide room for the expansion of the interconnect wiring 850 (a minimum wiring distance must be maintained between the interconnect wiring 850 and the TG line), resulting in the TG line further encroaching upon the PD region and blocking some of the light that should be reaching the PD region.

[Detailed Pixel Layout—Exemplary Embodiments]

FIGS. 9 and 10 illustrate a detailed pixel layout from a plan view of exemplary embodiments of the present disclosure. As with FIG. 8, in FIGS. 9 and 10 the layout of some circuit elements is shown in detail, while other circuit elements are merely represented schematically (their detailed layout not being of interest presently). The layout of the pixel in the exemplary embodiment of FIG. 9 is similar to that described above with respect to the comparative example, except that the interconnect 950 is provided instead of the interconnect 850. In addition, the gate electrode 815 of the transistor M5 and the global shutter line AB are illustrated in FIG. 9.

Unlike in the interconnect 850 of the comparative example, the interconnect 950 is not included in the M1 wiring layer. Instead, the interconnect 950 is included between the transistor gate layer 610 and the M1 wiring layer. Moreover, interconnect 950 is laid out so as to be overlapped by one of the M1 wirings (e.g., TG in the figure). By laying out the interconnect 950 in this manner, a capacitor 1400 (see FIG. 13) is created by the interconnect 950 and other circuit elements, which allows for the size of the FD to be reduced. This reduction in the size of the FD is particularly advantageous, as discussed further below. Moreover, because the interconnect 950 is between the M1 wirings and the gate electrodes, the transfer gate line TG can fully cover the FD, thus acting as a more effective light shield for the FD in certain front-side illuminated type image sensor embodiments.

Similarly to the interconnect 850, the interconnect 950 is a local interconnect wiring that connects the FD to the gate 814 of the amplifier transistor M4. Charge is transferred from the FD to the gate 814 of the amplifier transistor M4 via the interconnect 950.

Figure 13:
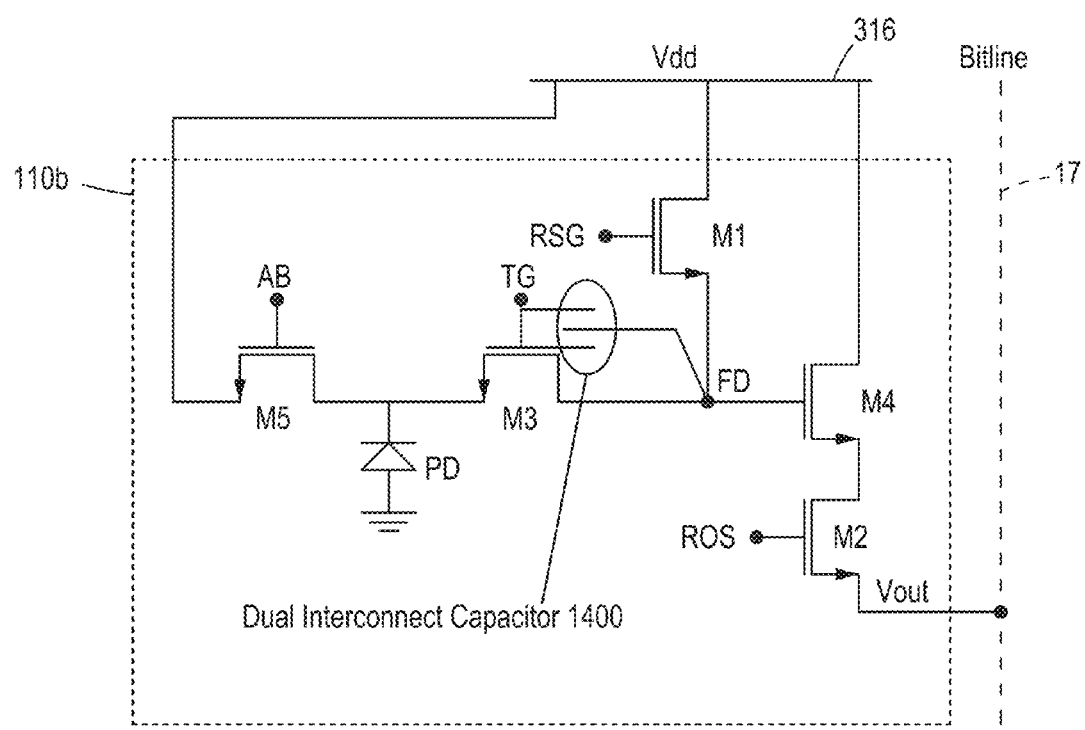
FIG. 13 illustrates a schematic diagram of an exemplary pixel circuit.

In the exemplary embodiment the TG line is arranged so as to overlap the interconnect 950—preferably to overlap substantially all of the interconnect 950. Because the interconnect 950 and the TG line overlap each other with a small separation therebetween, the interconnect 950 and the TG line form a capacitor 1400. Thus, the interconnect 950 acts as an electrode of a capacitor, in addition to functioning as local charge routing wiring for transferring charge between the FD and the gate 814. FIG. 13 illustrates schematically the location of the capacitor 1400 in the pixel 110b, and it will be understood that the capacitor 1400 would be similarly located in the schematic of pixel 110a.

The capacitance of the capacitor 1400 formed by the interconnect 950 allows the area of the FD to be made smaller, which is very advantageous. As the area of the floating diffusion junction becomes smaller, the amount of dark current flowing thereto decreases. Thus, decreasing the area of the FD can decrease noise associated with dark current. Moreover, as the area of the FD is made smaller, it is easier to provide light shielding to the FD without reducing fill factor.

However, the area of the FD cannot simply be arbitrarily decreased in order to reduce noise, because decreasing the area of the FD also decreases the amount of charge it can hold. The area of the FD must be sufficiently large that the FD can hold the full saturation charge of the PD. Accordingly, in the comparative example the FD area cannot be reduced beyond a certain minimum value, because doing so would cause the FD to fail to hold the full saturation charge of the PD.

On the other hand, in the exemplary embodiment the capacitor 1400 formed by the interconnect 950 provides extra charge storage capacity for the FD, which allows the area of the FD to be reduced beyond the minimum size of the FD in the comparative example while still ensuring that the full saturation charge of the photodiode can be held by the FD.

Moreover, at least a portion of the interconnect 950 is disposed between the TG line and the gate electrode 713 such that the TG line overlaps the portion of the interconnect 950, which in turn overlaps the gate electrode 713. Recall that the TG line and the gate electrode 713 are connected to each other, and thus are essentially equipotential. Thus, in this region of overlap the interconnect 950 forms a so-called dual capacitor or double capacitor with the TG line and the polysilicon gate electrode 713. A standard capacitor comprises two electrodes in close proximity, for example two overlapping parallel plates. A dual capacitor or double capacitor, on the other hand comprises three electrodes in close proximity, where the first and third electrodes are equipotential and the second electrode is disposed between the first and third electrodes. As is clear from the figures, part of the capacitor 1400 formed by the interconnect 950 is in the form of a dual capacitor, while other parts of the capacitor 1400 are in the form of a single capacitor. A dual capacitor has approximately double the capacitance of a similarly sized single capacitor. Thus, forming part of the capacitor 1400 as a dual capacitor greatly increases the capacitance of the capacitor 1400. Accordingly, the area of the FD can be correspondingly decreased even further as a result of the increased capacity from the dual capacitor.

In the above description, the capacitor 1400 is formed by the TG line, the gate electrode 713, and the interconnect 950. However, this configuration is merely exemplary, and the capacitor 1400 may be formed using circuit elements other than the TG line and the gate electrode 713, as long as the interconnect 950 is disposed between the gate electrode layer and the M1 wiring layer and such that a dual capacitor is formed between at least one gate electrode and an M1 wiring. For example, in the case in which the reset gate line RSG is an M1 wiring, the interconnect 950 may be overlapped by the reset gate line RSG and may form a dual capacitor using reset gate line RSG and the gate electrode 811.

In addition, as shown in FIG. 10, the TG line may be extended to include a dummy section 960 covering the boundary region between adjacent pixels. The section 960 is a "dummy" section because it is not a direct current path between circuit elements, but instead is merely a "dead-end" branch extending off of the main current path. In certain front-side illuminated type image sensor embodiments, such a dummy section 960 may be provided in the TG line in order to form a light shielding barrier between the pixels in order to reduce color mixing that occurs when light from one pixel's lens/filter bleeds over into an adjacent pixel's PD. Moreover, in front-side or back-side type image sensor embodiments, the dummy section 960 may be provided to increase the capacitance of the capacitor 1400. When such a dummy section 960 is provided in the TG line, the interconnect 950 may advantageously be extended so as to be overlapped by some or all of the dummy section 960, as shown in FIG. 10. This increases the area of overlap between the TG line and the interconnect 950, thereby increasing the capacitance of the capacitor formed by the interconnect 950.

Figure 11:
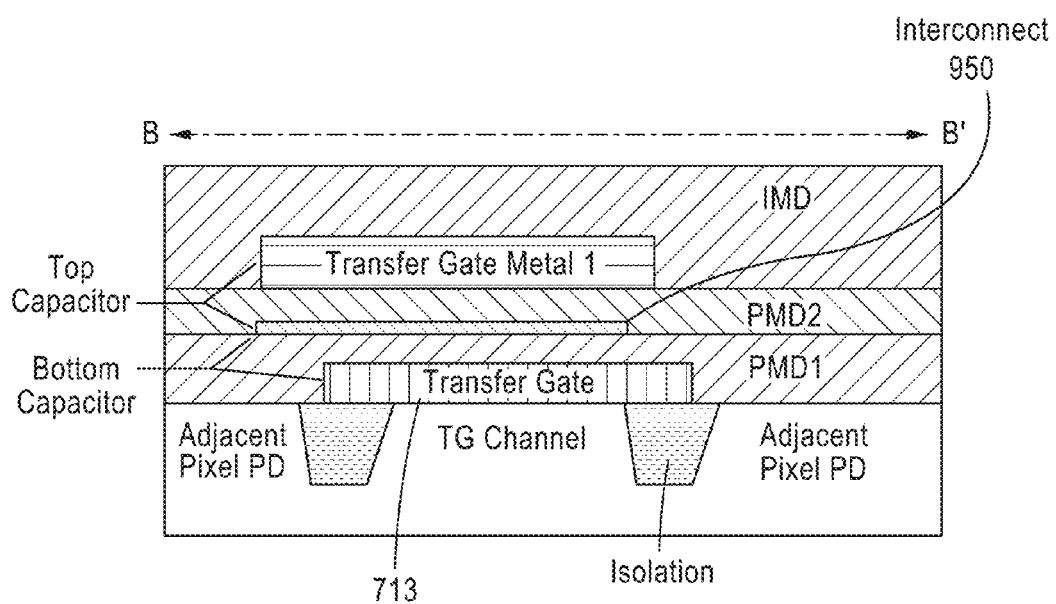
FIG. 11 illustrates cross section of an exemplary image sensor.

FIG. 11 illustrates a cross sectional view taken along the line B-B' of FIG. 9. As shown in the figure, the interconnect 950 forms a dual capacitor between the TG line and the gate electrode 713. The interconnect 950 should preferably be very thin, so that a thickness of the image sensor in a direction perpendicular to the substrate 700 (i.e., the vertical direction in the figure, hereinafter referred to simply as "the vertical direction") does not significantly increase when the interconnect 950 is added (as compared to the thickness of the image sensor in the case of the comparative example).

For example, the interconnect 950 should preferably have a thickness t in the vertical direction of less than 400 Å. When the interconnect 950 is less than 400 Å thick, the distance between the substrate 700 and the M1 wiring layer does not need to be significantly increased as a result of adding the interconnect 950. This allows the sensor 10 to be kept thin, which is a desirable feature for the image sensor 10. According to standard wiring layout rules, a distance between the interconnect 950 and the gate electrode 713 and between the interconnect 950 and the TG line must be maintained greater than a certain minimum value in order to maintain appropriate circuit operation (e.g., to prevent electrical breakdown). Thus, a minimum possible distance between the gate electrode 713 and between the TG line will depend upon the thickness of the interconnect 950. When the thickness of the interconnect 950 is 400 Å or less, then the minimum possible distance between the gate electrode 713 and between the TG line when the interconnect 950 is included is substantially similar to the minimum possible distance between the gate electrode 713 and between the TG line when the interconnect 950 is not included (e.g., a minimum distance in order to prevent interference between the M1 wiring layer and the gates electrodes), and thus the image sensor 10 that includes the interconnect 950 does not have to be made any thicker than the image sensor 10 that does not include the interconnect 950.

Figure 12:
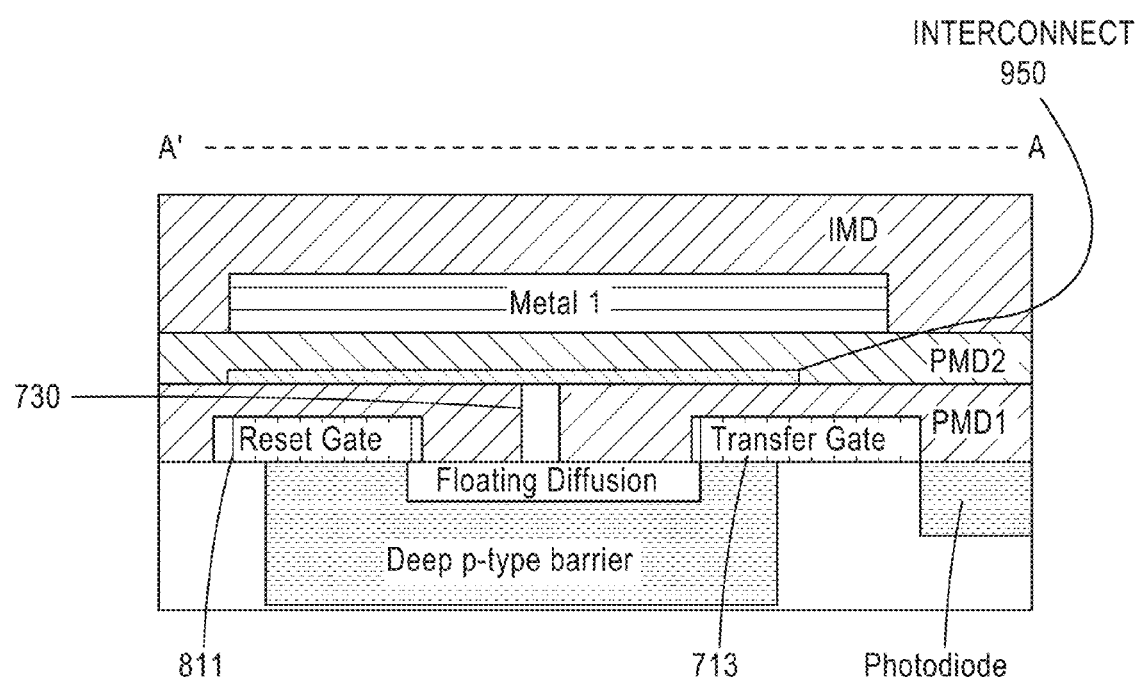
FIG. 12 illustrates cross section of an exemplary image sensor.

FIG. 12 illustrates a cross sectional view taken along the line A-A' of FIG. 9. As can be seen in FIG. 12, as well as in FIG. 9, the interconnect 950 may also be sandwiched between the TG line and the gate electrode 811, thereby further increasing its capacitance. Because the gate electrode 811 and the TG line are not necessarily equipotential, a dual capacitor according to the definition above is not necessarily formed between the gate electrode 811, interconnect 950, and TG line; however, a capacitance exists between the gate electrode 811 and the interconnect 950, and thus the overlap with the gate electrode 811 does still increase the capacitance of the capacitor 1400 formed by the interconnect 950.

Literally speaking, there exits some capacitance (perhaps infinitesimal) between any two distinct conductive objects of different potential. The capacitance will depend upon various factors including the shape of the objects, the distance between them, and the dielectric constant of any material between the two conductive objects. Generally speaking, the capacitance is proportional to the area of overlap of the two conductive objects and is inversely proportional to the distance therebetween. Thus, any two circuit elements may have a small unintended mutual capacitance, which is often referred to in the art as a "stray" or "parasitic" capacitance. It is common practice in the art to distinguish between a "capacitor" and the "stray" or "parasitic" capacitance between two circuit elements. A circuit element that is a "capacitor" is distinguishable from a circuit element that merely exhibits a parasitic capacitance in at least two ways: first, the functions it performs, and second, the magnitude of its capacitance. A capacitor is specifically designed to function at least in part as a capacitor, whereas parasitic capacitance is generally unintended. Moreover, a capacitor generally has a comparatively larger capacitance than the parasitic capacitances occurring in the same circuit (in particular, a capacitance sufficiently large to perform the specific function for which the capacitor is intended). In particular, an element may be considered a capacitor when it performs a function of storing charge and when the value $\in A/L$ for the prospective capacitor is large in comparison to the value $\in A/L$ between other circuit elements, where A is an area of overlap of the two conductive materials, L is the distance between the materials, and $\in$ is the dielectric constant of a material between the two conductive materials. In particular, the capacitor 1400 formed by the interconnect 950 is configured to store charge transferred to the FD from the PD, and must have a capacitance sufficiently large that the capacitor 1400 and the FD together can hold the full saturation charge of the PD.

Thus, in certain embodiments, in the capacitor 1400 formed by the interconnect 950, the distances between the interconnect 950 and the TG line and between the interconnect 950 and the gate electrode 713 are as small as possible in order to increase the capacitance of the capacitor 1400. In particular, in certain embodiments the distances between the electrodes of the capacitor 1400 are each at least less than $d_2$, and more preferably around $\frac{1}{2}(d_2)$–200 Å, where $d_2$ is the minimum possible distance between the gate electrode 713 and between the TG line in the case when the interconnect 950 is not included (e.g., a minimum distance set according to a wiring rule in order to prevent interference between the M1 wiring layer and the gates electrodes). This helps to ensure sufficient capacity to hold the full saturation charge of the PD.

Moreover, as illustrated in FIG. 12, in certain embodiments a deep p-type barrier is included around the FD. This helps to prevent parasitic electrons generated from stray light from diffusing into the FD. Moreover, it is also possible to include a deep p-type barrier at locations on the surface of the substrate 700 other than around the FD—in particular, deep p-type implants may be implanted generally in any region that is not specifically doped for another purpose, (e.g., excluding regions such as the PD, FD, and source/drain regions of the transistors).

In certain embodiments, the interconnect 950 is made of metal, and in some of these embodiments the metal is one that is suitable for use as an Aluminum or Copper diffusion barrier. For example, some suitable materials include TiTiN, Ta, TaN, and TiW. In one of the preferred embodiments, TiTiN is used.

FIGS. 9-12 illustrate pixel configurations and layouts that can be applied to either front-side illuminated or back-side illuminated type image sensors. Thus, certain embodiments of the present disclosure include front-side illuminated type image sensors, and certain other embodiments of the present disclosure include back-side illuminated type image sensors. The specific layout of various circuit elements of the pixels 110 and/or wirings of the wiring layer 720 may differ depending on the type of image sensor. For example, in front-side illuminated type image sensors it is preferable to arrange the wirings of the wiring layer 720 so as to allow the most desired light to reach the photodiode PD and to block the most parasitic light from reaching the photodiode PD. On the other hand, in back-side illuminated type image sensors, the wirings of the wiring layer 720 do not block light from reaching the photodiode PD, and thus can be arranged without regard to the aforementioned considerations related to light blockage. The specific layout of circuit elements and wirings shown in FIGS. 9-12 is merely exemplary, and could be changed without departing from the scope of the present disclosure. In certain embodiments, the layout of elements is immaterial as long as the dual capacitor 1400 is formed by the interconnect 950, a wiring from the M1 layer, and a gate electrode of a transistor in the pixel 110. In other embodiments, the specific layout of elements may be material. Thus, the scope of the appended claims should be limited to a specific layout only when and to the extent that such a layout is recited in the respective claim.

[Advantageous Effects of the Interconnect 950]

As noted above, the interconnect 950 provides an advantage in that it allows for the FD region to be made smaller than would otherwise be possible. Making the FD region smaller is advantageous in that it reduces dark noise. Moreover, as the size of the floating diffusion becomes smaller, the amount of parasitic light reaching the region is less, and it becomes easier to shield the FD region from light.

In addition, if the image sensor 10 is a front-side illuminated image sensor, the interconnect 950 also allows for more effective light shielding of the FD region than in the case of the comparative example. Because the interconnect 950 is not in the M1 layer (in contrast to the interconnect 850 of the comparative example), the TG line in the M1 layer can completely cover the FD as well as the region surrounding the FD. As discussed above, in the comparative example, the interconnect wiring 850 can just barely cover the FD region, which allows for some parasitic light to enter the FD region from around the sides of the interconnect wiring 850, and cannot expand to cover more of the area around the FD region without reducing the fill factor of the pixels. However, when the interconnect 950 is used, the TG line can cover more of the area surrounding the FD than the interconnect 850 could without reducing fill factor, thus reducing the amount of parasitic light entering the FD.

[Electronic Apparatuses]

An electronic apparatus may be configured to include the image sensor 10 described above. For example, electronic apparatuses may include digital cameras (both those configured to take still images and moving images), cellular phones, smartphones, tablet devices, personal digital assistants (PDAs), laptop computers, desktop computers, webcams, telescopes, sensors for scientific experiments, and any electronic apparatus for which it might be advantageous to detect light and/or capture images.

Figure 14:
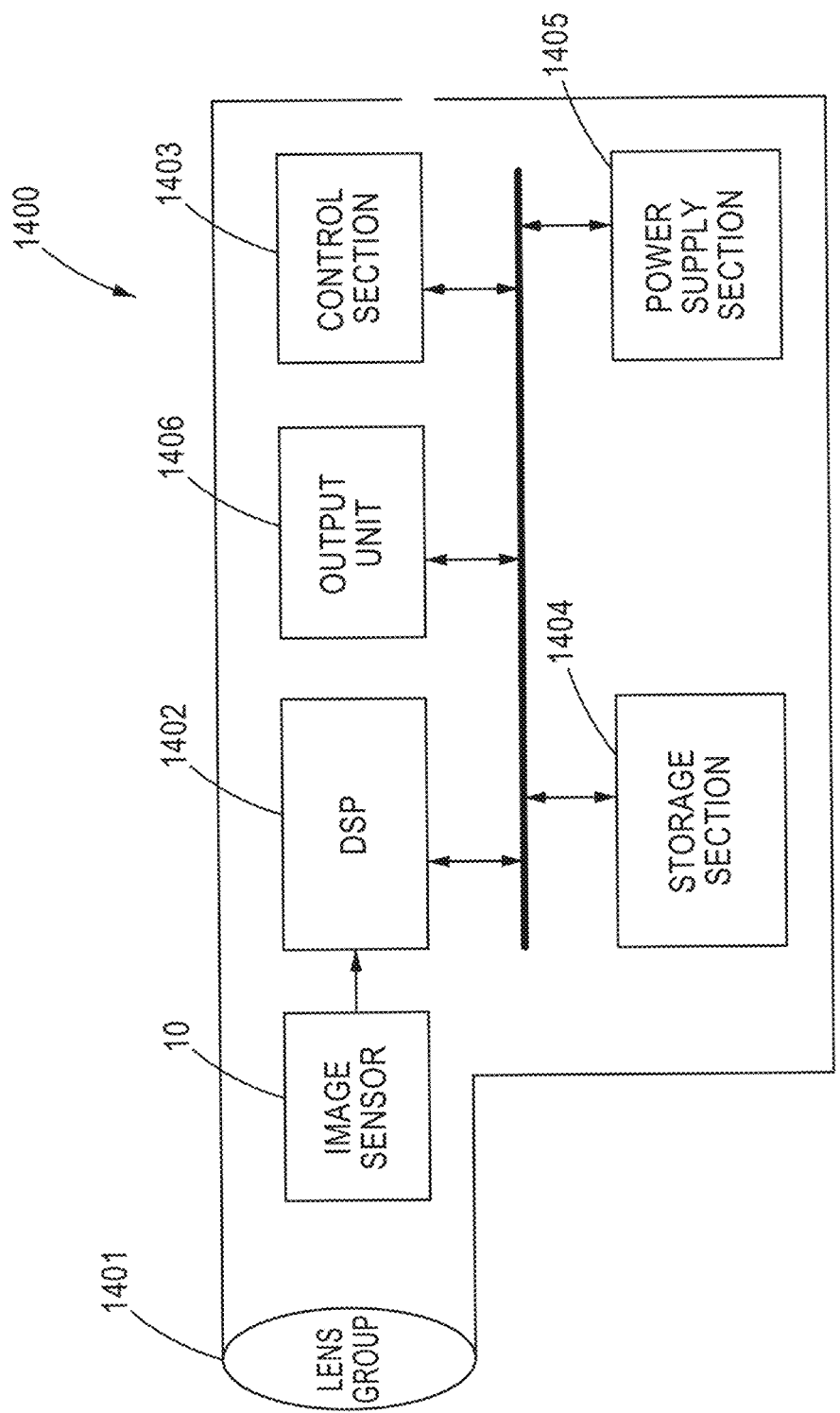
FIG. 14 illustrates an exemplary camera.
Figure 15:
FIG. 15 illustrates an example of geometric distortion in an image taken in rolling shutter mode.

An exemplary electronic apparatus in the form of a digital camera is shown in FIG. 14 and described below. However, it will be understood by those in the art that the image sensor 10 could be provided in a different electronic apparatus that has features similar to the features of the camera shown in FIG. 14, and that the electronic apparatus may include additional features not shown in FIG. 14 and/or could omit certain features shown in FIG. 14 as appropriate. The camera 1400 provides an optical system 1401 that is configured to direct light to the image sensor 10. In particular, an objective lens is provided that is configured to focus light at a focal point near the incident-light side of the image sensor 10. The objective lens may comprise a single lens, a lens group, or multiple lens groups. For example, a zoom-lens may be provided in which multiple lens groups are movable with respect to one another in order to zoom in or out. Moreover, a focusing mechanism may be provided in order to provide focusing functionality to the camera, for example by moving the objective lens and/or the image sensor 10 relative to each other.

Moreover, a digital signal processing section (DSP) 1402 may be provided to perform signal processing on signals received from the image sensor 10, a storage section 1403 may be provided for storing data generated by the image sensor 10, a control section 1404 may be provided to control operations of the image sensor 10, a power supply section 1405 may be provided to supply power to the image sensor 10, and an output unit 1406 may be provided for outputting captured image data. The control section 1404 may include a processor that executes instructions stored on non-transitory computer readable medium, for example a memory included in the storage section 1403. The output unit 1406 may be an interface for facilitating transmission of the stored data to external devices and/or for displaying the stored data as an image on a display device, which display device may be provided separate from or integral with the camera 1400.

The image sensor 10 itself may include various sections therein for performing signal processing of the pixel signals generated by the pixel array, and/or signal processing sections may be provided in the electronic apparatus separate from the image sensor 10. Preferably, the image sensor 10 itself performs some signal processing functions, in particular analog-to-digital conversion and CDS noise cancelling. The electronic apparatus may also preferably perform some signal processing functions, for example converting the raw data from the image sensor 10 into an image/video storage format (e.g., MPEG-4 or any known format), for example via the processor and/or via a dedicated signal processing section such as a video encoder/decoder unit.

In general, computing systems and/or devices, such as some of the above-described electronic apparatus, may employ any of a number of computer operating systems, including, but by no means limited to, versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OS X and iOS operating systems distributed by Apple Inc. of Cupertino, Calif., the BlackBerry OS distributed by Research In Motion of Waterloo, Canada, and the Android operating system developed by the Open Handset Alliance.

Computing devices generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, C#, Objective C, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. An image sensor, comprising:
   a plurality of pixels two-dimensionally arrayed, each including a light sensing element, a charge storage node, a transfer element between the light sensing element and the storage node, an output element, and a local metal interconnect that connects the charge storage node to a control electrode of the output element,
   wherein the local metal interconnect forms a parallel-plate dual capacitor with a control electrode of the transfer element and with a given pixel control wiring located in an M1 wiring layer.

2. The image sensor of claim 1,
   wherein the local metal interconnect and the given wiring collectively completely cover, from a plan perspective, the charge storage node.

3. The image sensor of claim 1,
   wherein, for each of the plurality of pixels, the charge storage node comprises a floating diffusion region.

4. The image sensor of claim 3,
   wherein, for each of the plurality of pixels, a deep p-type barrier is disposed around the floating diffusion region.

5. The image sensor of claim 4,
   wherein, for each of the plurality of pixels, the deep p-type barrier surrounds a pixel region that includes the light sensing element and the floating diffusion.

6. The image sensor of claim 3,
   wherein, for each of the plurality of pixels, a size of the floating diffusion region is smaller than a minimum size required for the floating diffusion region alone to store a full saturation charge of the light sensing element.

7. The image sensor of claim 1,
   wherein, for each of the plurality of pixels, the local metal interconnect is less than 400 Å thick in a direction perpendicular to the top surface of a substrate in which the photodiodes are formed.

8. The image sensor of claim 1,
   wherein the image sensor is configured as a back-side illumination type image sensor.

9. The image sensor of claim 1,
   wherein the local metal interconnect consists of TiTiN.

10. An electronic apparatus comprising the image sensor of claim 1.

11. The image sensor of claim 1,
    wherein the image sensor is configured as a back-side illumination type image sensor.

12. An image sensor, comprising:
    a plurality of pixels two-dimensionally arrayed, and
    a plurality of control wirings formed in wiring layers and each connected to more than one of the plurality of pixels and that control operations of the plurality of pixels;
    wherein each of the plurality of pixels includes:
      a light sensing element configured to generate charge,
      a charge storage node configured to hold the charge generated by the light sensing element at least until a readout operation has been performed,
      an output element configured to generate a pixel output signal corresponding to the charge when the readout operation is performed, and
      a local metal interconnect that electrically connects the charge storage node to a control electrode of the output element,
    wherein the local metal interconnect is formed in a layer that is located above the control electrode of the output element and below a lowest one of the wiring layers, and is configured such that a given wiring of the plurality of control wirings overlaps, from a plan perspective, the local metal interconnect so as to form a parallel plate capacitor in a region of overlap between the local metal interconnect and the given wiring.

13. The image sensor of claim 12,
    wherein the local metal interconnect and the given wiring collectively completely cover, from the plan perspective, the charge storage node.

14. The image sensor of claim 12,
    wherein each of the plurality of pixels includes a transfer element that is configured to selectively connect the light sensing element to the charge storage node, at least part of a control electrode of the transfer element being overlapped, from the plan perspective, by both the local metal interconnect and the given wiring, such that at least part of the parallel plate capacitor is a dual capacitor.

15. The image sensor of claim 14,
    wherein, for each of the plurality of pixels, a size of the floating diffusion region is smaller than a minimum size required for the floating diffusion region alone to store a full saturation charge of the light sensing element.

16. The image sensor of claim 15,
    wherein, for each of the plurality of pixels, the deep p-type barrier surrounds a pixel region that includes the light sensing element and the floating diffusion.

17. The image sensor of claim 14,
    wherein, for each of the plurality of pixels, a deep p-type barrier is disposed around the floating diffusion region.

18. The image sensor of claim 12,
wherein, for each of the plurality of pixels, the charge storage node comprises a floating diffusion region.

19. The image sensor of claim 12,
wherein, for each of the plurality of pixels, the local metal interconnect is less than 400 Å thick in a direction perpendicular to the top surface of the substrate.

20. The image sensor of claim 12,
wherein, for each of the plurality of pixels, the local metal interconnect is composed of TiTiN.

21. The image sensor of claim 12,
wherein, for each of the plurality of pixels, the given wiring overlaps, from the plan perspective, substantially all of the local metal interconnect.

22. The image sensor of claim 12,
wherein, for at least some of the plurality of pixels, the given wiring includes a dummy section that extends into a boundary region between adjacent pixels and the local metal interconnect extends into the boundary region so as to be overlapped by the dummy section.

23. The image sensor of claim 22,
wherein each of the plurality of pixels includes a global shutter transistor configured to selectively connect the photodiode to the power supply line.

24. The image sensor of claim 12,
wherein, for each of the plurality of pixels, the light sensing element is a photodiode, the charge storage node is a floating diffusion region, and the output element comprises an amplifier transistor and the control electrode of the output element comprises a gate electrode of the amplifier transistor, and each of the plurality of pixels further includes:
  a transfer transistor configured to selectively connect the photodiode to the floating diffusion region and that includes a polysilicon gate electrode formed in the electrode layer and connected to the given wiring,
  a reset transistor configured to selectively connect the floating diffusion region to a power supply line, and
  a readout transistor connected to the amplifier transistor and configured to selectively perform the readout operation, thereby allowing the pixel signal level to be read out.

25. The image sensor of claim 24,
wherein the control wirings control the operations of the plurality of pixels via control signals carried thereon, the control signals being applied to the control wirings by a control section, and
  the control section is configured to operate in a global shutter mode, in which the plurality of pixels are caused to begin each integration period substantially simultaneously via switching of the global shutter transistor and to end each integration period substantially simultaneously via switching of the transfer transistor.

26. The image sensor of claim 12,
wherein the parallel plate capacitor is configured such that the charge storage node and the parallel plate capacitor together are capable of holding a full saturation charge of the light sensing device.

27. An electronic apparatus comprising the image sensor of claim 12.

28. An image sensor, comprising:
  a plurality of pixels two-dimensionally arrayed, and
  a plurality of control wirings formed in wiring layers and each connected to more than one of the plurality of pixels and that control operations of the plurality of pixels;
wherein each of the plurality of pixels includes:
  a photodiode configured to generate charge,
  a floating diffusion region,
  a transfer transistor having a gate electrode that is connected to a given wiring of the control wirings and that is configured to connect the photodiode to the floating diffusion when a transfer operation is performed, thereby causing the floating diffusion region to receive the charge generated by the photodiode,
  an amplifier transistor having a gate electrode, the amplifier transistor being configured to generate a pixel output signal corresponding to the charge generated by the photodiode, and
  a local metal interconnect that electrically connects the floating diffusion region to the gate electrode of the amplifier transistor,
wherein the local metal interconnect is formed in a layer that is located above the gate electrode of the amplifier transistor and below a lowest one of the wiring layers, and is configured such that the given wiring overlaps, from a plan perspective, the local metal interconnect so as to form a parallel plate capacitor in a region of overlap between the local metal interconnect and the given wiring.

* * * * *